United States Patent
Landru et al.

(10) Patent No.: US 10,950,491 B2
(45) Date of Patent: Mar. 16, 2021

(54) METHOD FOR TRANSFERRING A USEFUL LAYER

(71) Applicants: Commissariat A L'Energie Atomique et aux Energies Alternatives, Paris (FR); Soitec, Bernin (FR)

(72) Inventors: Didier Landru, Le Champ-près-Froges (FR); Nadia Ben Mohamed, Echirolles (FR); Oleg Kononchuk, Theys (FR); Frederic Mazen, Saint Egreve (FR); Damien Massy, Grenoble (FR); Shay Reboh, Grenoble (FR); Francois Rieutord, Saint Egreve (FR)

(73) Assignees: Soitec, Bernin (FR); COMMISSARIAT Á L'ÈNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/324,461

(22) PCT Filed: Aug. 1, 2017

(86) PCT No.: PCT/FR2017/052161
§ 371 (c)(1),
(2) Date: Feb. 8, 2019

(87) PCT Pub. No.: WO2018/029419
PCT Pub. Date: Feb. 15, 2018

(65) Prior Publication Data
US 2019/0221471 A1    Jul. 18, 2019

(30) Foreign Application Priority Data

Aug. 11, 2016 (FR) ...................................... 1657722

(51) Int. Cl.
H01L 21/762    (2006.01)
H01L 21/324    (2006.01)
H01L 21/263    (2006.01)

(52) U.S. Cl.
CPC ...... *H01L 21/76254* (2013.01); *H01L 21/263* (2013.01); *H01L 21/324* (2013.01); *H01L 21/76251* (2013.01)

(58) Field of Classification Search
CPC ......... H01L 21/76254; H01L 21/76251; H01L 21/263; H01L 21/324
See application file for complete search history.

(56) References Cited

U.S. PATENT DOCUMENTS

| | | | |
|---|---|---|---|
| 5,985,742 A | 11/1999 | Henley et al. | |
| 7,820,527 B2 | 10/2010 | Nunan et al. | |

(Continued)

FOREIGN PATENT DOCUMENTS

| | | |
|---|---|---|
| EP | 2933828 B1 | 10/2016 |
| FR | 3020175 | 5/2016 |
| WO | 2013/140065 A1 | 9/2013 |

OTHER PUBLICATIONS

Massy et al, Fracture Dynamics in Implanted Silicon, Applied Physics Letters, vol. 107, No. 9, Aug. 31, 2015, abstract only.

(Continued)

*Primary Examiner* — Ermias T Woldegeorgis
(74) *Attorney, Agent, or Firm* — TraskBritt (57) ABSTRACT

A useful layer is layered onto a support by a method that includes the steps of forming an embrittlement plane by implanting light elements into a first substrate, so as to form a useful layer between such plane and one surface of the first substrate; applying the support onto the surface of the first substrate so as to form an assembly to be fractured; applying a heat treatment for embrittling the assembly to be fractured; and initiating and propagating a fracture wave into the first (Continued)

substrate along the embrittlement plane. The fracture wave is initiated in a central area of the embrittlement plane and the propagation speed of the wave is controlled so that the velocity thereof is sufficient to cause the interactions of the fracture wave with acoustic vibrations emitted upon the initiation and/or propagation thereof, if any, are confined to a peripheral area of the useful layer.

18 Claims, 4 Drawing Sheets

(56) References Cited

U.S. PATENT DOCUMENTS

2007/0281445 A1* 12/2007 Nguyen ............ H01L 21/76254
 438/465

2010/0330779 A1 12/2010 Okuno et al.

OTHER PUBLICATIONS

International Written Opinion for International Application No. PCT/FR2017/052161 dated Nov. 7, 2017, 7 pages.
International Search Report for International Application No. PCT/FR2017/052161 dated Nov. 7, 2017, 3 pages.
Holsteyns et al., Unpatterned Wafer, Seeing Through the Haze, Process Monitoring and Qualification Using Comprehensive Surface Data, Yield Management Solutions, Spring 2004, pp. 50-54.
Feng et al, Mechanics of Smart-Cut Technology, International Journal of Solids and Structures, vol. 41, Issues 16-17, Aug. 2004, pp. 4299-4320.
Penot et al., Development of microcracks in hydrogen-implanted silicon substrates, Journal of Applied Physics, Sep. 2013, 8 pages.

* cited by examiner

METHOD FOR TRANSFERRING A USEFUL LAYER

CROSS-REFERENCE TO RELATED APPLICATIONS

This application is a national phase entry under 35 U.S.C. § 371 of International Patent Application PCT/FR2017/052161, filed Aug. 1, 2017, designating the United States of America and published as International Patent Publication WO 2018/029419 A1 on Feb. 15, 2018, which claims the benefit under Article 8 of the Patent Cooperation Treaty to French Patent Application Serial No. 1657722, filed Aug. 11, 2016.

TECHNICAL FIELD

The present disclosure relates to a method for transferring a useful layer.

BACKGROUND

Figure 1:
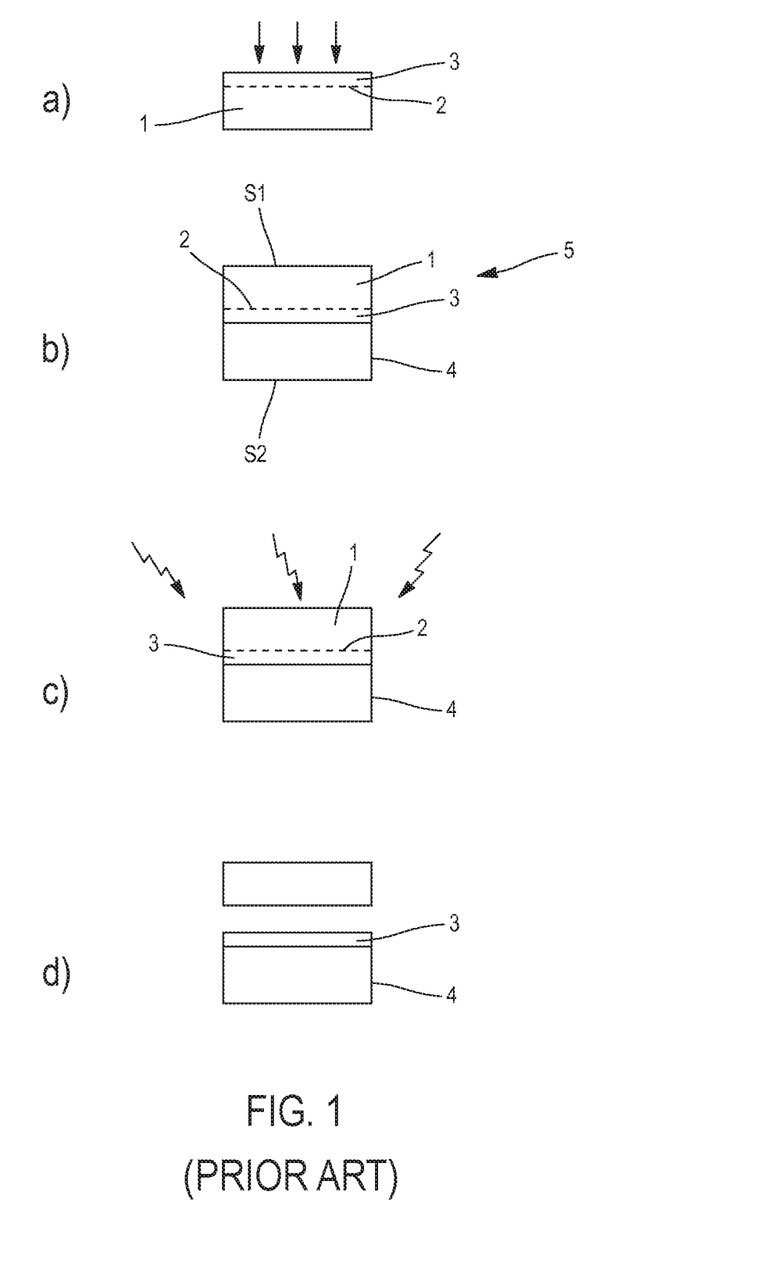
FIG. 1 shows a method for transferring a useful layer according to the state of the art.

A method for transferring a useful layer 3 onto a support substrate 4 is known from document FR3020175, as shown in FIG. 1, with such method including the following main steps:
  a) forming an embrittlement plane 2 by implanting low atomic weight elements into a first substrate 1, so as to form a useful layer 3 between such plane and one surface of the first substrate 1;
  b) applying the support 4 onto the surface of the first substrate 1 so as to form an assembly to be fractured 5 having two exposed surfaces S1, S2;
  c) applying a heat treatment for embrittling the assembly to be fractured 5;
  d) initiating and propagating a fracture wave into the first substrate 1 along the embrittlement plane 2.

Figure 2:
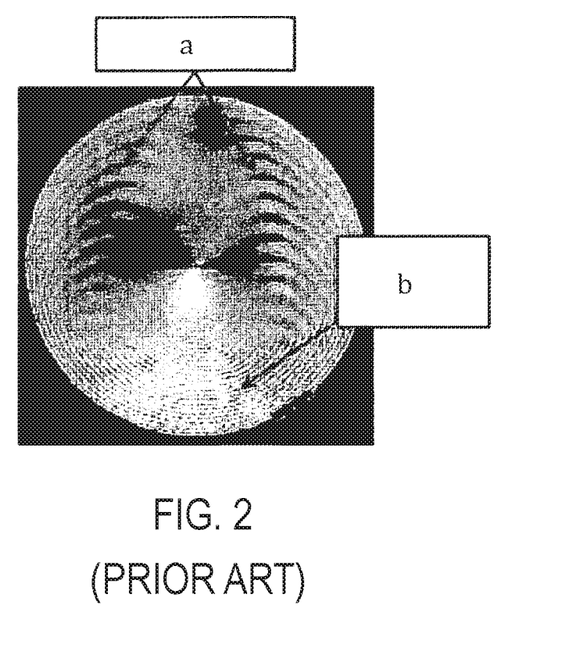
FIG. 2 shows a view of the haze emitted by a useful layer of the prior art showing the periodical patterns of variation in the thickness.

According to this document, acoustic vibrations are emitted upon the initiation and/or the propagation of the fracture wave. The interaction between the fracture wave and such acoustic vibrations results in the forming of periodical patterns of variation in the thickness of the formed useful layer, which extend on the whole surface of the layer. In other words, the fracture wave is vertically deviated relative to the progression plane thereof, according to the state of the instantaneous stress of the material it goes through, with such stress state being affected by the acoustic wave. FIG. 2 thus shows the patterns of variation in the thickness of the useful layer transferred according to the method disclosed above. In the illustrated example, the patterns comprise side and circular patterns (respectively indicated by a and b in FIG. 2). Such patterns have been made apparent by measuring the "haze" as per the current English terminology, corresponding to the intensity of light broadcast by the layer surface, using the inspection tool SURFSCAN™ by the KLA-Tencor company. Reference can be made to the article "Seeing Through the Haze" by F. Holsteyns, Yield Management Solution, Spring 2004, pp. 50-54 for further information on such inspection technique.

To solve this problem, the above document teaches equipping the assembly to be fractured with an absorbing element for detecting and dissipating the emitted acoustic wave, and preventing or limiting the formation of such patterns of variation in the thickness of the useful layer. Although this method is efficient, it nevertheless requires the implementation of an absorbing element on at least one of the faces of the assembly to be fractured, which makes the method for transferring the useful layer more complex.

BRIEF SUMMARY

One object of the present disclosure is to provide a simple method for transferring a useful layer, with such useful layer having a reduced pattern of variation in the thickness thereof.

To this end, the disclosure provides a method for transferring a useful layer onto a support comprising the following steps:
  forming an embrittlement plane by implanting light species into a first substrate, so as to form a useful layer between the plane and one surface of the first substrate;
  applying the support onto the surface of the first substrate so as to form an assembly to be fractured;
  applying a heat treatment for embrittling the assembly to be fractured;
  initiating and propagating a fracture wave into the first substrate along the embrittlement plane.

The method is characterized in that the fracture wave is initiated in a central area of the embrittlement plane and the propagation speed of the wave is controlled so that the velocity thereof is sufficient. Thus, the interactions of the fracture wave with acoustic vibrations emitted upon the initiation and/or propagation thereof are limited to a peripheral area of the useful layer 3.

The method disclosed herein makes it possible to limit the formation of periodical patterns of variation in the thickness to one part only of the useful layer.

According to other advantageous and not restrictive characteristics of the disclosure, taken either separately or in any technically feasible combination:
  the propagation speed of the fracture wave is controlled so as to have a velocity higher than one third of the speed of the acoustic wave;
  the first substrate is made of silicon, and the propagation of the fracture wave is controlled so as to have a velocity above 2 km/second;
  the propagation of the fracture wave is controlled so as to have a velocity ranging from 2 km/second to 4.5 km/second; preferably from 3.8 km/second to 4.2 km/second;
  the fracture wave is initiated by applying the embrittlement heat treatment and the propagation speed is controlled by selecting the temperature of the heat treatment upon the initiation;
  the temperature of the embrittlement heat treatment is above 400° C., or 500° C.;
  the initiation of the fracture wave is caused by an incipient fracture positioned in the central area of the embrittlement plane, or in the vicinity of the central area;
  the incipient fracture consists of a volume containing low atomic weight elemental species at a higher concentration compared to the average concentration in the embrittlement plane;
  the incipient fracture consists of a cavity or a body positioned at the interface between the first substrate and the support in line with the central area of the embrittlement plane;
  the fracture wave is initiated by energy input at the central area of the embrittlement plane;
  the propagation speed is controlled by calibrating the embrittlement heat treatment so that the embrittlement plane has a maturing rate at least equal to a target maturing rate;

the first substrate consists of a disk-shaped wafer, and the central area comprises the geometric center of the wafer;

the peripheral area consists of an annular area, the inner radius of circle of which is greater than ⅔, and preferably greater than 80%, of the radius of the first substrate;

the peripheral area is totally encompassed in one exclusion area of the useful layer.

BRIEF DESCRIPTION OF THE DRAWINGS

Further characteristics and advantages of the disclosure will be clear from the following detailed description, made in reference to the accompanying figures, among which.

DETAILED DESCRIPTION

The phenomena disclosed in the presentation of the prior art has been thoroughly studied to provide an original method for transferring a useful layer. This original approach does not aim at limiting the development of the acoustic wave, for instance, by collecting it and/or by absorbing it, but at limiting the interaction thereof with the fracture wave. The forming of the periodical patterns of variation in the thickness is thus limited to one part only of the layer.

Thus, it was noted that the acoustic wave would propagate from a fracture initiation point, at a speed higher than that of the fracture wave, and that the origin of the wave pattern originated from the interferences caused by the collision between the fracture wave and the reflection, on the ends of the assembly to be fractured, of the acoustic wave. The propagation characteristics of the acoustic wave, and specifically the speed thereof, can be measured by piezoelectric sensors positioned on one and/or the other faces of the assembly to be fractured.

To limit such interferences, the method disclosed herein provides, on the one hand, placing the point of initiation of the fractures away from the ends of the assembly to be fractured, i.e., to placing the point of initiation at a distance from the substrate edges, at a central area of the embrittlement plane. Thus, the moment when the reflected acoustic wave meets, the fracture wave is delayed relative to the fracture initiation time.

Simultaneously, the method disclosed herein involves controlling the speed of propagation of the fracture wave. The speed of propagation of the fracture wave is selected to be high enough for the area where the fracture wave and the reflected acoustic wave (which will have the periodical patterns of the variation in thickness of the useful layer) to be confined to a peripheral area of the assembly to be fractured. In the most advantageous situations, specifically if the speed of the fracture wave is high enough, the peripheral area can be encompassed in one exclusion area of the useful layer, i.e., an area where components are generally not intended to be formed. Such exclusion area may be 0.5 to 2 or 3 millimeters, at the periphery of the useful layer. The surface of the useful layer not encompassed within the peripheral area is mainly free of periodical patterns and thus has the required characteristics as regards thickness uniformity.

It should be noted that the principle of the disclosure is based on the assumption, verified by the inventors of the present application, that the speed of propagation of the acoustic wave has no direct (for instance, proportional) link with the speed of propagation of the fracture wave.

As a matter of fact, if an assembly to be fractured having a circular shape and a radius R, is considered, Vg indicates the speed of the acoustic wave in the plane defined by the assembly to be fractured, and Vf is the speed of the fracture wave, then the distance d between the center of the assembly to be fractured (from where the fracture is initiated) and the place where both waves collide meets the following equation:

$$d/Vf=(2R-d)/Vg$$

assuming that, at the meeting point, the fracture wave has travelled on a distance d, at a speed Vf, and the reflected acoustic wave has travelled on a distance (2R−d) at a speed Vg. It can thus be determined that such distance d satisfies the following equation:

$$d=2R/1+Vg/Vf$$

It can thus be noted that such distance d can be controlled so as to be as close to R as possible, insofar as the Vg/Vf ratio can be controlled too, to be close to 1.

Figure 3:
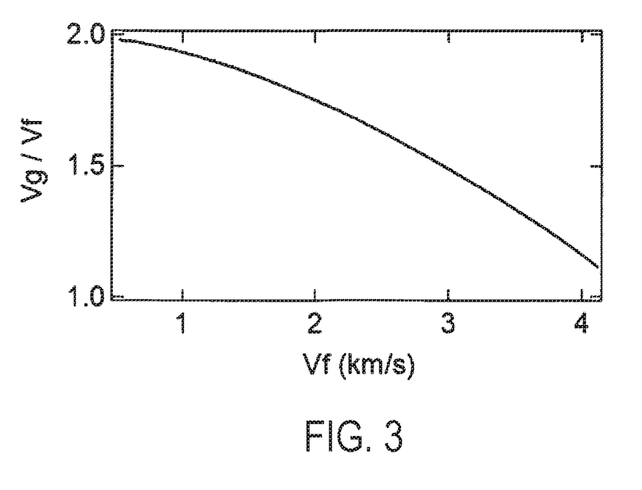
FIG. 3 shows a diagram of the experimental relationship between the speed of the fracture wave and the speed of the acoustic wave.

FIG. 3 shows results of experiments carried out by the inventors of the present application, showing the Vg/Vf ratio for various speeds Vf of the fracture wave. Such measurements have been obtained when the method for transferring a layer is applied to a first silicon substrate.

It can be noted that the Vg/Vf ratio can be selected from a wide range from 1 to 2, by selecting the value of the fracture wave speed Vf. For a low speed of the fracture wave, of the order of 1 km/second, the speed of the acoustic wave is almost twice as high (Vg/Vf close to 2). Therefore, the meeting area is an annular area, the inner radius of which is equal to ⅔ of the radius R of the assembly to be fractured.

For a high speed of the fracture wave, the speed of the acoustic wave is slightly higher than that of the fracture wave (Vg/VF close to 1). The meeting area is then limited to an annular area, the inner radius of which is very close to the radius R of the assembly to be fractured, and so almost non-existent.

Figure 4:
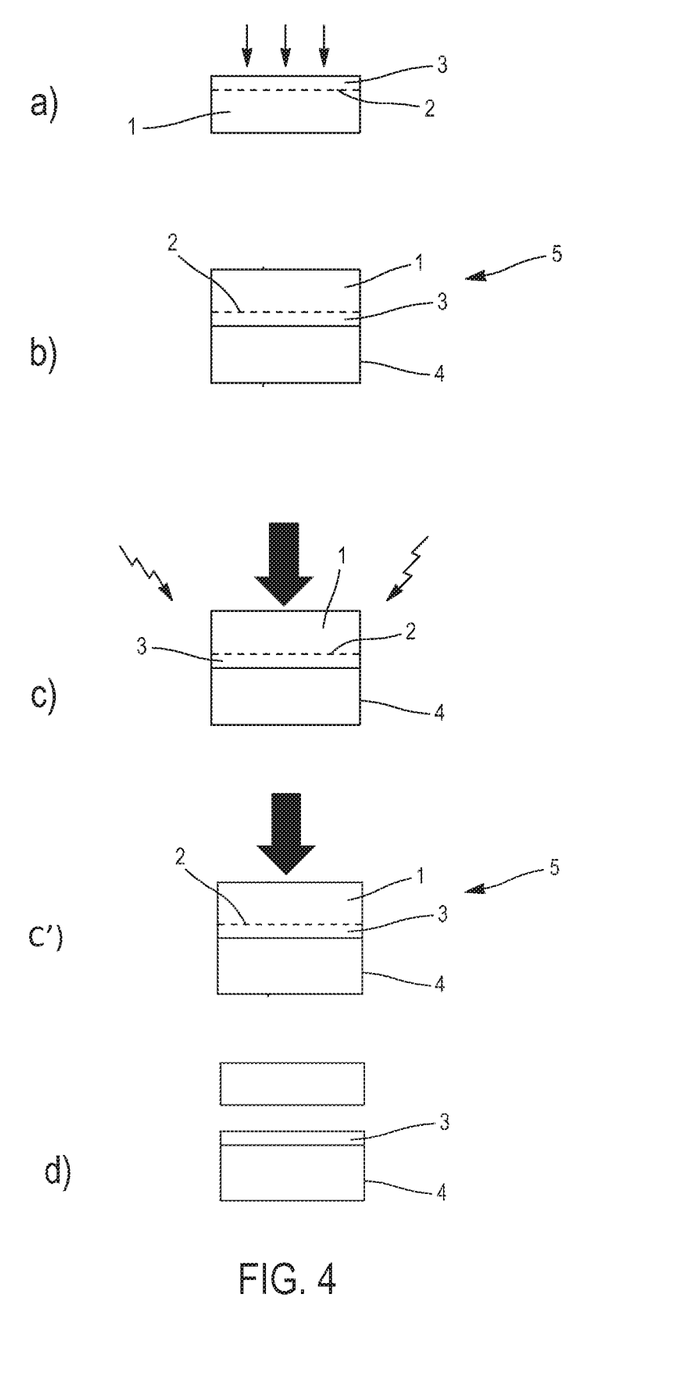
FIG. 4 shows a method for transferring a useful layer according to the disclosure.

On the basis of the study, the present disclosure provides a method for transferring a useful layer 3 onto a support 4 comprising the steps as shown in FIG. 4, Panels a) to d).

In a first step as shown in FIG. 4, Panel a), an embrittlement plane 2 is formed, for instance, by implanting low atomic weight elemental species into the first substrate 1. The first substrate 1 may be made of silicon, or any other material, whether semi-conductive or not. It may be germanium, for instance, or gallium nitride, lithium tantalate, or sapphire. Layers can be deposited beforehand, onto the surface, using a deposition or a heat treatment. It may be a layer made of silicon dioxide, obtained by thermal oxidation of a silicon board or a layer obtained by any kind of epitaxial deposition: SiGe; InGaN; AlGaN, Ge, etc.

The first substrate 1 may be a disk-shaped wafer, with standard dimensions, for instance, 200 mm or 300 mm, or even 450 mm in diameter. However, the disclosure is in no way restricted to these dimensions or this shape.

As for the low atomic weight elemental species, these may be any species able to embrittle the first substrate 1 at the embrittlement plane thereof. It may be hydrogen and/or helium.

The embrittlement plane 2 defines, with a surface of the first substrate, the useful layer 3.

In a second step shown in Panel b), a support 4 is applied onto the surface of the first substrate 1 so as to form an assembly to be fractured 5. The support 4 may comprise a silicon wafer, or a substrate made of any material and having any shape, for instance, made of sapphire or glass. Like the first substrate 1, the support 4 may be provided, beforehand, with superficial layers of any kind.

The support 4 can be applied onto the surface of the first substrate using any direct assembling method: molecular adhesion, thermo-compression, electrostatic bonding, etc. It may also comprise applying an adhesive layer onto the support 4 and/or the first substrate 1, such as glue. The application of the support 4 may also involve the deposition of a material onto the surface of the first substrate 1, with the deposited layer forming the support 4.

In a further step shown in Panel c), an embrittlement heat treatment is then applied to the assembly to be fractured 5. Such a heat treatment weakens the first substrate 1 at the embrittlement plane 2, and supplies sufficient energy for the fracture wave, once initiated, to propagate in a self-sustained way. Such a heat treatment is typically carried out at temperatures ranging from 150° C. to 600° C. for 30 minutes to 8 hours, for instance, for 4 hours at 400° C.

In a first alternative embodiment, the heat treatment is sufficient, in itself, to initiate the fracture wave. Upon completion of the heat treatment, the useful layer 3 is totally removed from the first substrate 1, as shown in FIG. 4, Panel d).

In a second alternative embodiment, shown in FIG. 4, Panel c'), the method comprises a local addition of energy, prior to, or during the embrittlement heat treatment, to initiate the fracture wave. Such energy may have a mechanical, thermal, or any other origin. It may originate for a local heating by a laser, for instance, or ultrasonic energy input.

Whatever the alternative embodiment, once initiated, the fracture wave propagates in a self-sustained way so as to detach and transfer the useful layer 3 onto the support 4, as shown in Panel d) in FIG. 4.

According to the present disclosure, the fracture wave that is created during one of the steps shown in FIG. 4, Panels c) and c') is initiated at a central area of the embrittlement plane 2. In these figures, the initiation in the central area is symbolized by large arrows.

The fracture wave does not have to be initiated precisely at the geometric center of such embrittlement plane 2. Thus, the central area of initiation may correspond to a circular surface area substantially centered on the geometric center of the embrittlement plane. Such a surface area may correspond to 20%, 10% or 5% of the total surface of the embrittlement plane 2. As explained above, when the fracture is initiated at one point of this area, it is far enough from the edges of the assembly to be fractured 5 to delay the moment when the fracture wave interacts with the reflected acoustic wave.

Several approaches are possible to cause the initiation of the fracture in such a central area. An incipient fracture can thus be placed in this area or close thereto, in a step prior to the step of heat treatment. During this step, the incipient fracture is an advantageous place for initiating such fracture.

Such an incipient fracture can thus be formed by introducing low atomic weight elemental species into the first substrate 1, at the central area of the embrittlement plane 2. A volume, which defines the incipient fracture, is thus formed, and has light elemental species at a higher concentration relative to the average concentration of the embrittlement plane 2. Such excess light elemental species can thus be introduced prior to, during, or after the step of forming the embrittlement plane 2, and in any case, prior to the step of assembling the support 4 and the first substrate 1. The main dimensions of the incipient fracture can range from 10 nm to a few millimeters. The excess elemental species can be introduced into the first substrate 1, by means of a local implantation, with or without a previous masking of the first substrate 1. For instance, a local implantation of hydrogen on a surface area, 1 mm in diameter, in a dose (in addition to the one forming the embrittlement plane) of $1e^{16}$ at/cm$^2$ makes it possible to initiate the fracture during the step of embrittlement heat treatment, specifically at such overimplanted area forming the incipient fracture.

The incipient fracture can also be formed at the assembling interface between the first substrate 1 and the support 4, in line with the central area of the embrittlement plane 2. It may comprise a cavity, for instance, made by etching, at the surface of the first substrate 1 or the support 4, or of a body having reduced dimensions positioned at such interface. The presence of such body or cavity results in local stress during the embrittlement heat treatment, which favors the initiation of the fracture wave in the central area, as disclosed, for instance, in document US 2010/330779.

When the fracture wave is caused during the step of embrittlement heat treatment because of the presence of an incipient fracture, the heat treatment can be evenly applied to the assembly to be fractured 5.

As an alternative to the insertion of an incipient fracture, or in addition thereto, the initiation can be caused by local energy input at the central area during or after the step of the embrittlement heat treatment. The heat treatment equipment may be configured so that, during the treatment, the central area receives more heat energy than the peripheral area.

In some embodiments, the local application of energy may be applied using a light beam (a laser, for instance) or a particle beam (ions, electrons).

In some embodiments, additional mechanical energy may be applied such as, for example, vibrations transmitted by an ultrasonic generator, for instance, a piezoelectric generator, at the central area.

In the last two examples, local energy input can be carried out during the step of the embrittlement heat treatment or during a possible additional step dedicated to such local energy input.

Whatever the technique selected to initiate the fracture at the central area of the embrittlement plane 2, the present disclosure also comprises controlling the fracture wave propagation speed so that it has a sufficient speed, thus limiting the interactions with the acoustic vibrations emitted upon the initiation and/or propagation of the fracture wave.

As explained above, a sufficient speed makes it possible to limit such interactions so that they occur, if at all, only within a peripheral area. The higher the speed of the fracture wave, the smaller the surface area of the peripheral area in which the interactions may occur. The periodical patterns of variation in thickness are thus limited to this peripheral area of the useful layer 3. Thus, when the first substrate is made of silicon, the fracture wave propagation can advantageously be controlled to have a speed above 2 km/second and preferably between 2 and 4.5 km/second, or more preferably equal or close to 4 km/second, for example from 3.8 to 4.2 km/second.

More generally, and according to one preferred embodiment of the disclosure, the fracture wave propagation speed will be controlled so that it is higher than or equal to one third of the acoustic wave speed (i.e., Vg/3), so that the peripheral area, wherein the periodical patterns are confined, is smaller than R/2.

Depending on the method selected for initiating the fracture (whether thermal and/or mechanical), the operational parameters of such method can be so selected as to control the fracture wave propagation speed. For this purpose, use can be made of the device for measuring the fracture wave speed disclosed in document WO 2013/140065.

Thus, when the fracture initiation is obtained, as regards temperature, for instance, when the embrittlement heat treatment causes such initiation by itself, reference can be made to the document "Fracture Dynamics in Implanted Silicon" by D. Massy et al., Applied Physics Letters 107 (2015), to select the temperature making it possible to obtain the targeted fracture wave speed. Particularly, a temperature above 400° C. or 500° C. can be selected. The document discloses a method making it possible to link the fracture wave propagation speed to the wave embrittlement and/or initiation operational parameters. It specifically mentions that, in the case of a first silicon substrate, the fracture wave propagation speed can be controlled between approximately 1 km/second and 4 km/second when the temperature, upon the initiation of the fracture, varies from about 300° C. to 700° C.

In embodiments that comprise a local energy input to initiate the fracture wave, the maturing rate of the embrittlement plane, as obtained upon completion of the embrittlement heat treatment, can vary. The maturing rate corresponds to the surface covered by micro-cracks formed in the embrittlement plane, upon applying local energy, causing the initiation of the fracture. As a matter of fact, the fracture wave propagation speed depends on the maturing rate: the higher the parameter, the higher the fracture wave propagation speed.

Maturing rates can be measured by measuring the surface covered by the micro-cracks, for instance, using an infrared microscope to calibrate the embrittlement heat treatment making it possible to reach a target fracture speed. Such heat treatment can also be adjusted so that the embrittlement area has a maturing rate at least equal to a target maturing rate, which makes it possible to reach or exceed a targeted fracture speed.

Figure 5A:
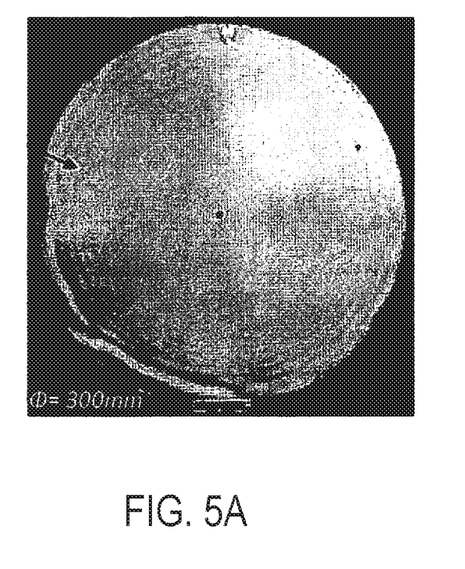
FIG. 5A shows a view of the haze emitted by a useful layer obtained by a method according to the disclosure.

FIG. 5A shows a view of the haze emitted by a useful layer obtained by a method according to the present disclosure.

The useful layer 3 of FIG. 5A results from a method comprising a step of forming an incipient fracture by implanting an amount of $1e^{16}$ at/cm$^2$ of hydrogen at the geometric center of a first substrate consisting of a silicon board. After assembling with a support also made of a silicon board, the fracture was initiated at the incipient fracture, during an embrittlement heat treatment at 350° C. for 30 hours.

The fracture wave propagated at a speed of the order of 2.8 km/sec.

It can be noted that the useful layer shown in FIG. 5A has periodical patterns of variation in the thickness, which are confined to a peripheral annular area, the inner radius of which is larger than 80% of the radius of the useful layer. The central surface area of the useful layer is free of periodical patterns of variation in thickness.

Figure 5B:
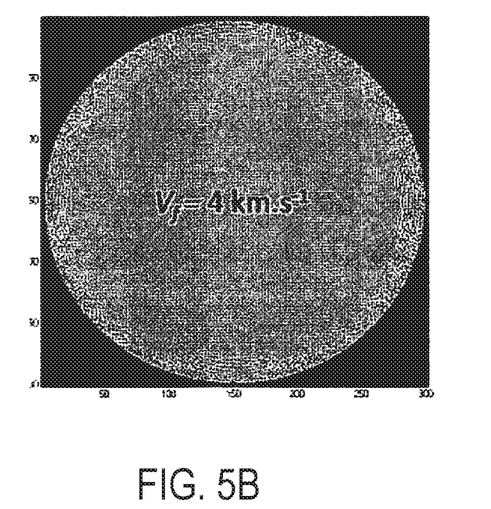
FIG. 5B shows a view of a useful layer obtained by a simulation of a method according to the disclosure.

FIG. 5B shows a view of a useful layer obtained by a simulation of a method according to the disclosure, when the fracture wave is propagated at 4 km/second.

This view of the useful layer 3 shows that a very narrow annular area comprising the periodical patterns of variation in thickness is provided on the periphery.

This last figure is a perfect illustration of the advantage that can be taken from the present disclosure to form a useful layer with enhanced evenness properties.

The invention claimed is:

1. A method for transferring a useful layer onto a support comprising the following steps:
    forming an embrittlement plane by implanting light elemental species into a first substrate, so as to define a useful layer between the embrittlement plane and one surface of the first substrate;
    applying the support onto the surface of the first substrate so as to form an assembly to be fractured;
    applying a heat treatment for embrittling the assembly to be fractured; and
    initiating and propagating a fracture wave in the first substrate along the embrittlement plane;
    wherein:
        the fracture wave is initiated in a central area of the embrittlement plane;
        the propagation speed of the fracture wave is controlled so that the velocity thereof is sufficient to cause interactions of the fracture wave with acoustic vibrations emitted upon the initiation and/or propagation thereof, if any, are confined to a peripheral area of the useful layer; and
        the propagation speed of the fracture wave is controlled so as to have a velocity higher than one third of the speed of the acoustic wave.

2. The method of claim 1, wherein the first substrate comprises silicon, and wherein the propagation of the fracture wave is controlled so as to have a velocity above 2 km/sec.

3. The method of claim 2, wherein the propagation of the fracture wave is controlled so as to have a velocity ranging from 2 km/second to 4.5 km/second.

4. The method of claim 3, wherein the propagation of the fracture wave is controlled so as to have a velocity ranging from 3.8 km/second to 4.2 km/second.

5. The method of claim 1, wherein the temperature of the embrittlement heat treatment is above 400° C.

6. The method of claim 5, wherein the temperature of the embrittlement heat treatment is above 500° C.

7. The method of claim 1, wherein the initiation of the fracture wave is caused by an incipient fracture positioned in the central area of the embrittlement plane.

8. The method of claim 7, wherein the incipient fracture comprises a volume containing a higher concentration of light elemental species compared to the average concentration in the embrittlement plane.

9. The method of claim 1, wherein the fracture wave is initiated by energy input at the central area of the embrittlement plane.

10. The method of claim 9, wherein the propagation speed is controlled by causing the embrittlement plane to have a maturing rate at least equal to a target maturing rate during the embrittlement heat treatment.

11. The method of claim 1, wherein the peripheral area comprises an annular area, an inner radius of the annular area being greater than ⅔ of the radius of the first substrate.

12. The method of claim 11, wherein the peripheral area is totally encompassed in one exclusion area of the useful layer.

13. The method of claim 11, wherein the inner radius of the annular area is greater than 80% of the radius of the first substrate.

14. The method of claim 1, wherein the fracture wave is initiated by applying the embrittlement heat treatment and wherein the propagation speed is controlled by selecting the temperature of the embrittlement heat treatment at the time of the initiation.

15. The method of claim 7, wherein the incipient fracture comprises a cavity or a body positioned at the interface between the first substrate and the support in line with the central area of the embrittlement plane.

16. The method of claim 1, wherein the first substrate comprises a disk-shaped board, and wherein the central area comprises the geometric center of the board.

17. A method for transferring a useful layer onto a support comprising the following steps:
- forming an embrittlement plane by implanting light elemental species into a first substrate, so as to define a useful layer between the embrittlement plane and one surface of the first substrate;
- applying the support onto the surface of the first substrate so as to form an assembly to be fractured;
- applying a heat treatment for embrittling the assembly to be fractured; and
- initiating and propagating a fracture wave in the first substrate along the embrittlement plane;

wherein:
- the fracture wave is initiated in a central area of the embrittlement plane;
- the propagation speed of the fracture wave is controlled so that the velocity thereof is sufficient that interactions of the fracture wave with acoustic vibrations emitted upon the initiation and/or propagation thereof, if any, are confined to a peripheral area of the useful layer;
- the fracture wave is initiated by energy input at the central area of the embrittlement plane; and
- the propagation speed is controlled by causing the embrittlement plane to have a maturing rate at least equal to a target maturing rate during the embrittlement heat treatment.

18. A method for transferring a useful layer onto a support comprising the following steps:
- forming an embrittlement plane by implanting light elemental species into a first substrate, so as to define a useful layer between the embrittlement plane and one surface of the first substrate;
- applying the support onto the surface of the first substrate so as to form an assembly to be fractured;
- applying a heat treatment for embrittling the assembly to be fractured; and
- initiating and propagating a fracture wave in the first substrate along the embrittlement plane;

wherein:
- the fracture wave is initiated in a central area of the embrittlement plane;
- the propagation speed of the fracture wave is controlled so that the velocity thereof is sufficient to cause interactions of the fracture wave with acoustic vibrations emitted upon the initiation and/or propagation thereof, if any, are confined to a peripheral area of the useful layer; and
- the peripheral area comprises an annular area, an inner radius of the annular area being greater than ⅔ of the radius of the first substrate.

* * * * *